United States Patent
Lee et al.

(10) Patent No.: US 8,537,255 B2
(45) Date of Patent: Sep. 17, 2013

(54) IMAGE SENSORS

(75) Inventors: Kyung-Ho Lee, Suwon-si (KR);
Jung-Chak Ahn, Yongin-si (KR);
Dong-Yoon Jang, Hwaseong-si (KR);
Wook Lee, Anyang-si (KR); Tae-Sub Jung, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 479 days.

(21) Appl. No.: 12/801,740

(22) Filed: Jun. 23, 2010

(65) Prior Publication Data

US 2011/0037883 A1 Feb. 17, 2011

(30) Foreign Application Priority Data

Aug. 11, 2009 (KR) .................. 10-2009-0073591

(51) Int. Cl.
*H04N 3/14* (2006.01)
*H04N 9/083* (2006.01)
*H04N 5/335* (2011.01)
*H04N 9/04* (2006.01)

(52) U.S. Cl.
USPC ............ 348/273; 257/435; 257/436; 257/440

(58) Field of Classification Search
USPC ...................... 348/374; 257/435, 436, 440
See application file for complete search history.

(56) References Cited

U.S. PATENT DOCUMENTS

| | | | |
|---|---|---|---|
| 7,838,956 B2* | 11/2010 | McCarten et al. | 257/447 |
| 2004/0041224 A1* | 3/2004 | Chao et al. | 257/444 |
| 2005/0139769 A1* | 6/2005 | Kita et al. | 250/310 |
| 2008/0054386 A1* | 3/2008 | Akram | 257/432 |
| 2008/0173963 A1 | 7/2008 | Hsu et al. | |
| 2008/0293180 A1* | 11/2008 | Mouli | 438/69 |
| 2009/0152603 A1* | 6/2009 | Kim | 257/292 |

FOREIGN PATENT DOCUMENTS

| | | |
|---|---|---|
| KR | 10-0710210 | 4/2007 |
| KR | 10-0720461 | 5/2007 |
| KR | 10-2007-0069833 | 7/2007 |
| KR | 10-2008-0014261 | 2/2008 |
| KR | 10-2008-0014301 | 2/2008 |

* cited by examiner

*Primary Examiner* — Anthony J Daniels
(74) *Attorney, Agent, or Firm* — Harness, Dickey & Pierce, P.L.C.

(57) ABSTRACT

Image sensors including a semiconductor substrate, a plurality of photo detecting elements, a dielectric layer, a plurality of color filters, and a plurality of micro lenses. The photo detecting elements may be in the semiconductor substrate and may convert an incident light into an electric signal. The dielectric layer may be on the semiconductor substrate and may include a plurality of photo blocking regions on regions between the photo detecting elements. The color filters may be on the dielectric layer and may be disposed corresponding to the plurality of photo detecting elements, respectively. The micro lenses may be on the plurality of color filters and may be disposed corresponding to the plurality of photo detecting elements, respectively.

14 Claims, 10 Drawing Sheets

IMAGE SENSORS

CROSS-REFERENCE TO RELATED APPLICATION

This application claims priority under 35 USC §119 to Korean Patent Application No. 2009-0073591, filed on Aug. 11, 2009, in the Korean Intellectual Property Office (KIPO), the entire contents of which is incorporated herein by reference.

BACKGROUND

1. Field

Example embodiments of the inventive concepts relate to image sensors, and more particularly to back-illuminated image sensors.

2. Description of the Related Art

An image sensor is a device that converts an optical image into an electric signal. The image sensor may include a converting unit that converts incident light into an electric signal and a logic unit that processes the electric signal to generate data. The image sensor may include a micro lens array that adjusts a path of light to focus the light on the converting unit such that the image sensor has improved light sensitivity.

In a conventional image sensor, incident light passing through a micro lens may not reach a unit pixel to which the micro lens corresponds due to diffraction of the micro lens. The incident light may reach an adjacent unit pixel and result in optical crosstalk.

SUMMARY

Example embodiments may provide an image sensor capable of suppressing and/or reducing optical crosstalk.

According to example embodiments of the inventive concepts, an image sensor may include a semiconductor substrate, a plurality of photo detecting elements, a dielectric layer, a plurality of color filters, and a plurality of micro lenses. The plurality of photo detecting elements are formed in the semiconductor substrate, and are configured to convert an incident light into an electric signal. The dielectric layer is formed on the semiconductor substrate, and includes a plurality of photo blocking regions formed on regions between the plurality of photo detecting elements. The plurality of color filters are formed on the dielectric layer, and are disposed corresponding to the plurality of photo detecting elements, respectively. The plurality of micro lenses are formed on the plurality of color filters, and are disposed corresponding to the plurality of photo detecting elements, respectively.

The plurality of photo blocking regions may include a plurality of metal lines. The plurality of metal lines may reflect a diffraction component of the incident light generated when the incident light is diffracted by the plurality of micro lenses. The plurality of metal lines may be disposed in a grid pattern. The plurality of metal lines may include a plurality of ground lines. The plurality of photo blocking regions further may include a plurality of contacts for electrically connecting the plurality of metal lines to the semiconductor substrate. The plurality of photo blocking regions may be formed such that the pluralities of color filters are vertically extended into the dielectric layer. The plurality of photo blocking regions may filter, at least two times, a diffraction component of the incident light generated when the incident light is diffracted by the plurality of micro lenses.

Each photo blocking region may include at least two extended color filters that pass different color components of the incident light. The plurality of photo blocking regions may have a plurality of recesses formed adjacent to boundary lines between the plurality of color filters, and the plurality of color filters may have a plurality of protrusions formed corresponding to the plurality of recesses. The dielectric layer may be formed on a back surface of the semiconductor substrate. In some embodiments, the image sensor may further include a front side dielectric layer formed on a front surface of the semiconductor substrate, and a plurality of gate structures formed in the front side dielectric layer, and configured to transfer and amplify the electric signal.

According to example embodiments of the inventive concepts, an image sensor may include a semiconductor substrate, a plurality of photo detecting elements, a dielectric layer, a plurality of metal lines, a plurality of color filters, and a plurality of micro lenses. The plurality of photo detecting elements are formed in the semiconductor substrate, and convert an incident light into an electric signal. The dielectric layer is formed on a back surface of the semiconductor substrate. The plurality of metal lines are formed in the dielectric layer, and are disposed on regions between the plurality of photo detecting elements. The plurality of color filters are formed on the dielectric layer, and are disposed corresponding to the plurality of photo detecting elements, respectively.

The plurality of micro lenses may be formed on the plurality of color filters, and may be disposed corresponding to the plurality of photo detecting elements, respectively. The plurality of metal lines may reflect a diffraction component of the incident light generated when the incident light is diffracted by the plurality of micro lenses. The plurality of metal lines may be disposed in a grid pattern. The plurality of metal lines may include a plurality of ground lines.

According to example embodiments of the inventive concepts, an image sensor may include a semiconductor substrate, a plurality of photo detecting elements, a dielectric layer, a plurality of color filters, and a plurality of micro lenses. The plurality of photo detecting elements are formed in the semiconductor substrate, and convert an incident light into an electric signal. The dielectric layer is formed on a back surface of the semiconductor substrate. The plurality of color filters are formed on the dielectric layer, and are disposed corresponding to the plurality of photo detecting elements, respectively. The plurality of color filters are vertically extended into a plurality of regions in the dielectric layer above regions between the plurality of photo detecting elements. The plurality of micro lenses are formed on the plurality of color filters, and are disposed corresponding to the plurality of photo detecting elements, respectively.

The extended color filters may filter, at least two times, a diffraction component of the incident light generated when the incident light is diffracted by the plurality of micro lenses. The diffraction component of the incident light may be filtered by the extended color filters that pass different color components of the incident light. The dielectric layer may have a plurality of recesses formed adjacent to boundary lines between the plurality of color filters, and the plurality of color filters may have a plurality of protrusions formed corresponding to the plurality of recesses.

According to example embodiments of the inventive concepts, an image sensor may include a semiconductor substrate, first and second photo detecting elements in the semiconductor substrate, a dielectric layer on the semiconductor substrate, a photo blocking region in the dielectric layer, the photo blocking region on a region of the semiconductor substrate that is at least one of between and adjacent to the first and second photo detecting elements, first and second color filters on the dielectric layer, the first and second color filters corresponding to the first and second photo detecting elements and first and second micro lenses on the first and second color filters, the first and second micro lenses corresponding to the first and second photo detecting elements.

According to example embodiments of the inventive concepts, an image sensor may include a semiconductor substrate, a plurality of photo detecting elements in the semiconductor substrate, the plurality of photo detecting elements configured to convert incident light into at least one electric signal, a dielectric layer on a back surface of the semiconductor substrate, a plurality of metal lines in the dielectric layer on regions of the substrate between the plurality of photo detecting elements, a plurality of color filters on the dielectric layer, the plurality of color filters corresponding to the plurality of photo detecting elements and a plurality of micro lenses on the plurality of color filters, the plurality of micro lenses corresponding to the plurality of photo detecting elements.

According to example embodiments of the inventive concepts, an image sensor may include a semiconductor substrate, a plurality of photo detecting elements in the semiconductor substrate, the plurality of photo detecting elements configured to convert incident light into at least one electric signal, a dielectric layer on a back surface of the semiconductor substrate, a plurality of color filters on the dielectric layer, the plurality of color filters corresponding to the plurality of photo detecting elements, the plurality of color filters including a plurality of extensions extending into a plurality of regions of the dielectric layer, the plurality of regions of the dielectric layer on regions of the substrate that are between the plurality of photo detecting elements and a plurality of micro lenses on the plurality of color filters, the plurality of micro lenses corresponding to the plurality of photo detecting elements.

BRIEF DESCRIPTION OF THE DRAWINGS

Illustrative, non-limiting example embodiments of the inventive concepts will be more clearly understood from the following brief description taken in conjunction with the accompanying drawings. FIGS. 1-7D represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will be described more fully hereinafter with reference to the accompanying drawings, in which example embodiments are shown. Example embodiments of the inventive concepts may, however, be embodied in many different forms and should not be construed as limited to the example embodiments set forth herein. Rather, these example embodiments are provided so that this disclosure will be thorough and complete, and will fully convey the concept of example embodiments of the inventive concepts to those skilled in the art. In the drawings, the sizes and relative sizes of layers and regions may be exaggerated for clarity. Like reference numerals refer to like elements throughout.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments of the inventive concepts only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
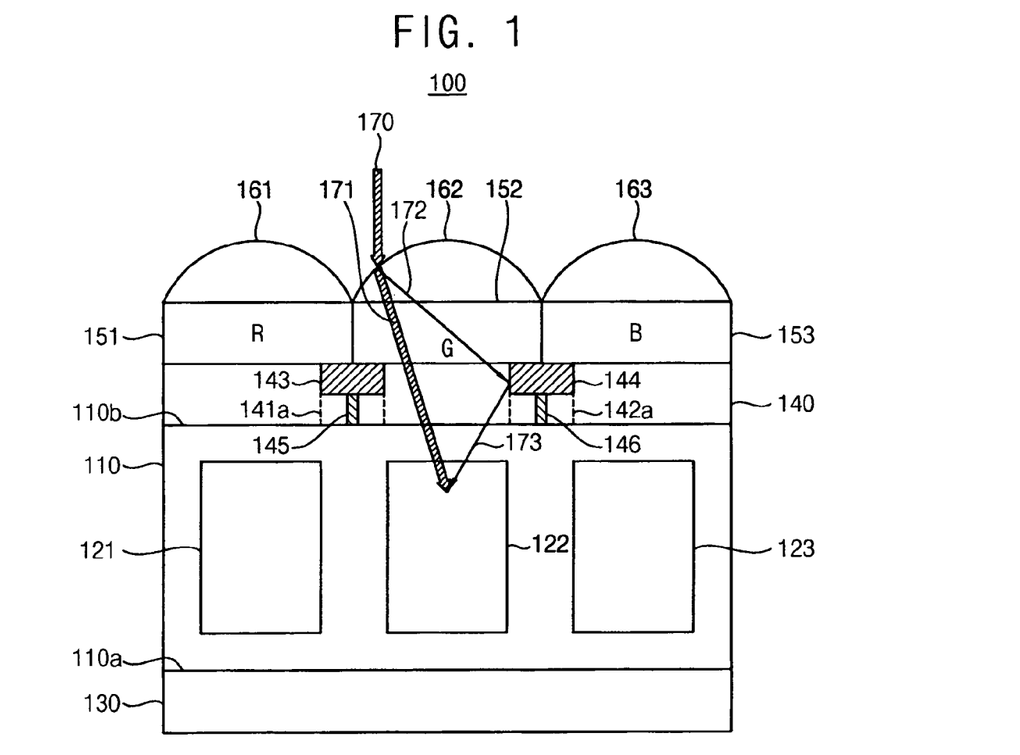
FIG. 1 is a cross-sectional diagram of a portion of an image sensor according to example embodiments of the inventive concepts.

FIG. 1 is a cross-sectional diagram of a portion of an image sensor according to example embodiments of the inventive concepts. Referring to FIG. 1, an image sensor 100 may include a semiconductor substrate 110, a plurality of photo detecting elements 121, 122 and 123, a first dielectric layer 130, a second dielectric layer 140, a plurality of color filters 151, 152 and 153, and a plurality of micro lenses 161, 162 and 163. The semiconductor substrate 110 may have a front surface 110a and a back surface 110b. The image sensor 100 may be a backside illuminated image sensor (BIS) that generates image data in response to an incident light passing through the back surface 110b of the semiconductor substrate 110. The semiconductor substrate 110 may include an epitaxial layer and may be doped with, for example, p-type impurities.

In the image sensor 100 according to example embodiments of the inventive concepts, a plurality of gate structures (not shown), which transfer and amplify an electric signal corresponding to the incident light, may be on the front surface 110a of the semiconductor substrate 110. The color filters 151, 152 and 153 and the micro lenses 161, 162 and 163, through which incident light passes, may be on the back surface 110b. Because the gate structures, and metal lines coupled to the gate structures, are not between the micro lenses 161, 162 and 163, and the photo detecting elements 121, 122 and 123, diffused reflection and/or scattering due to the gate structures and the metal lines may not occur. The distance from the micro lenses 161, 162 and 163 to the photo detecting elements 121, 122 and 123 may be short. Light guiding efficiency and light sensitivity may be improved in the image sensor 100 according to example embodiments of the inventive concepts.

The photo detecting elements 121, 122 and 123 may be in the semiconductor substrate 110. The photo detecting elements 121, 122 and 123 may convert incident light into an electric signal. For example, the photo detecting elements 121, 122 and 123 may generate an electron-hole pair in response to incident light, and may collect the electron and/or the hole of the electron-hole pair. Each of the photo detecting elements 121, 122 and 123 may include a photo diode, a photo transistor, a photo gate, a pinned photo diode (PPD), or a combination thereof. The photo detecting elements 121, 122 and 123 may be in a matrix pattern.

The first dielectric layer 130 may be on the front surface 110a of the semiconductor substrate 110. The gate structures (not shown) that process the electric signal may be in the first dielectric layer 130. The gate structures may transfer, amplify and output the electric signal generated by the photo detecting elements 121, 122 and 123. For example, the gate structures may include a plurality of transfer gates for transferring charges from the photo detecting elements 121, 122 and 123 to floating diffusion nodes, a plurality of reset gates for discharging the floating diffusion nodes, a plurality of drive gates for amplifying voltages of the floating diffusion nodes, and a plurality of select gates for outputting the amplified voltages as the electric signal in response to a select signal. According to example embodiments of the inventive concepts, a plurality of metal lines (not shown) may be in the first dielectric layer 130. The metal lines may be electrically connected to the gate structures through contacts and/or plugs.

The photo detecting elements 121, 122 and 123, and the gate structures may be part of unit pixels. Each unit pixel may have various structures, for example, a one-transistor structure, a three-transistor structure, a four-transistor structure, a five-transistor structure, a structure where some transistors are shared by a plurality of unit pixels, and/or the like.

The second dielectric layer 140 may be on the back surface 110b of the semiconductor substrate 110. The second dielectric layer 140 may include a plurality of photo blocking regions 141a and 142a. The photo blocking regions 141a and 142a may be on regions between the photo detecting elements 121, 122 and 123. The photo blocking regions 141a and 142a may prevent and/or reduce incident light, that enters a micro lens corresponding to a photo detecting element, from reaching a non-corresponding photo detecting element, thereby suppressing and/or reducing optical crosstalk The color filters 151, 152 and 153 may be on the second dielectric layer 140. The color filters 151, 152 and 153 may correspond to the photo detecting elements 121, 122 and 123, respectively. For example, a first color filter 151 may correspond to a first photo detecting element 121, a second color filter 152 may correspond to a second photo detecting element 122, and a third color filter 153 may correspond to a third photo detecting element 123. The color filters 151, 152 and 153 may be in a matrix pattern. According to example embodiments of the inventive concepts, the color filters 151, 152 and 153 may be a Bayer filter including red filters, green filters and/or blue filters. According to example embodiments of the inventive concepts, the color filters 151, 152 and 153 may include yellow filters, magenta filters, and/or cyan filters. The color filters 151, 152 and 153 may include white filters.

The micro lenses 161, 162 and 163 may be on the color filters 151, 152 and 153. The micro lens 161, 162 and 163 may correspond to the photo detecting elements 121, 122 and 123 and to the color filters 151, 152 and 153, respectively. For example, a first micro lens 161 may correspond to the first photo detecting element 121, a second micro lens 162 may correspond to the second photo detecting element 122, and a third micro lens 163 may correspond to the third photo detecting element 123. Each micro lens 161, 162 and 163 may adjust a path of light entering the micro lens such that the light is focused on a corresponding photo detecting element. The micro lenses 161, 162 and 163 may be disposed in a matrix pattern.

According to example embodiments of the inventive concepts, the image sensor 100 may further include logic circuits (not shown) that generate image data based on the electric signal. For example, the image sensor 100 may include a timing generator, a row decoder, a row driver, a correlated double sampler, an analog-to-digital converter, a latch unit, and/or a column decoder. The timing generator may provide a timing signal and a control signal to the row decoder and the column decoder. The row driver may provide driving signals to unit pixels in response to signals from the row decoder. The correlated double sampler may sample and hold the electric signal from the unit pixels. The analog-to-digital converter may convert the electric signal into a digital signal. The latch unit may latch the digital signal, and may output the latched signal as the image data in response to signals from the column decoder.

The photo blocking regions 141a and 142a may include a plurality of metal lines 143 and 144. The metal lines 143 and 144 may be on regions between the photo detecting elements 121, 122 and 123. The metal lines 143 and 144 may be disposed in a grid pattern having rows and columns. The metal lines 143 and 144 may have a height lower than and/or substantially the same as that of the second dielectric layer 140. The metal lines 143 and 144 may reflect a diffraction component of incident light passing through a micro lens to prevent and/or reduce the diffraction component of the incident light from reaching a non-corresponding photo detecting element.

According to example embodiments of the inventive concepts, the metal lines 143 and 144 may be ground lines. For example, the photo detecting elements 121, 122 and 123 may collect electrons from electron-hole pairs generated in response to the incident light, and the metal lines 143 and 144 may provide drains for the holes of the electron-hole pairs. The metal lines 143 and 144 may be coupled to at least one pad and an external device may apply a ground voltage to the metal lines 143 and 144 through the at least one pad. The photo blocking regions 141a and 142a may include a plurality of contacts 145 and 146 for electrically connecting the metal lines 143 and 144 to the semiconductor substrate 110. For example, the holes generated in the semiconductor substrate 110 may be discharged to the metal lines 143 and 144 through the contacts 145 and 146.

A path 170 of incident light passing through the second micro lens 162 may be adjusted by the second micro lens 162 so that the light enters the second photo detecting element 122. A main component 171 of the incident light 170 may correctly reach the second photo detecting element 122. If the incident light 170 is diffracted by the second micro lens 162, a diffraction component 172 of the incident light 170 may be directed to the third photo detecting element 123. The metal line 144 in the second dielectric layer 140 may reflect the diffraction component 172 so that is does not reach the third photo detecting element 123. The diffraction component 172 may be reflected by the metal line 144 and may reach the second photo detecting element 122 as a reflected component 173.

As described above, in the image sensor 100 according to example embodiments of the inventive concepts, the metal lines 143 and 144 in the second dielectric layer 140 may reflect a diffraction component of an incident light, thereby suppressing and/or reducing optical crosstalk. Because the metal lines 143 and 144 may be on regions between the photo detecting elements 121, 122 and 123, a ratio of a photo detecting region to a whole size (e.g., a fill factor) may not decrease.

Figure 2:
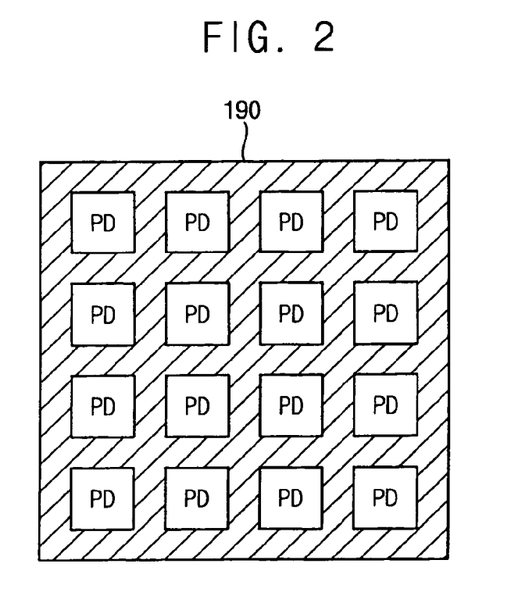
FIG. 2 is a plan view of a plurality of metal lines included in the image sensor of FIG. 1.

FIG. 2 is a plan view of a plurality of metal lines included in the image sensor of FIG. 1. Referring to FIGS. 1 and 2, a plurality of metal lines including first and second metal lines 143 and 144 may be on regions between photo detecting elements PD and/or on regions outside the photo detecting elements PD. The plurality of metal lines may be in a grid pattern 190 having rows and columns. Because the plurality of metal lines are on the regions between and/or outside the photo detecting elements PD, the image sensor 100 according to example embodiments may efficiently suppress and/or reduce optical crosstalk without a decrease in fill factor.

Figure 3A:
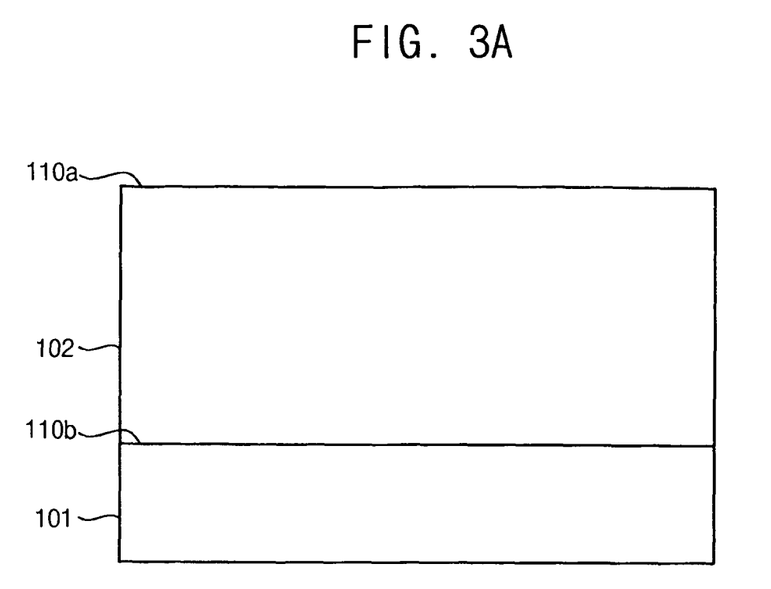
FIGS. 3A-3J are cross-sectional diagrams illustrating methods of fabricating the image sensor of FIG. 1.
Figure 3B:
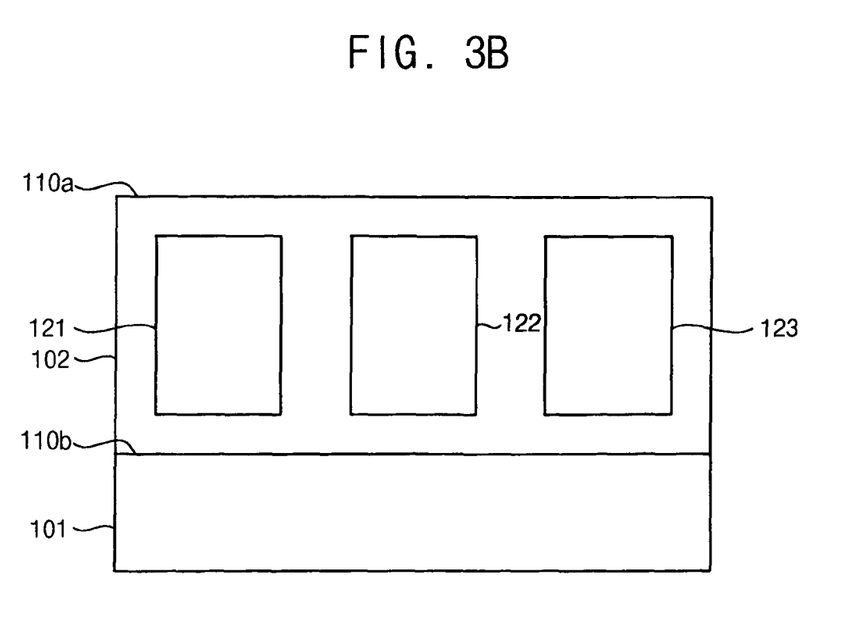

FIGS. 3A-3J are cross-sectional diagrams illustrating methods of fabricating the image sensor of FIG. 1. Referring to FIG. 3A, an epitaxial layer 102 (e.g., a p-type epitaxial layer) may be formed on a bulk silicon substrate 101 (e.g., a p-type bulk silicon substrate). The epitaxial layer 102 may be grown on the bulk silicon substrate 101 using silicon source gas (e.g., silane, dichlorosilane (DCS), trichlorosilane (TCS), and/or hexachlorosilane (HCS)). Referring to FIG. 3B, a plurality of photo detecting elements 121, 122 and 123 may be formed in the epitaxial layer 102. For example, photo diodes may be formed as the photo detecting elements 121, 122 and 123 such that regions (e.g., n-type regions) are formed in the epitaxial layer 102 using, for example, an ion implantation process. According to example embodiments of the inventive concepts, each photo detecting element may include a photo diode, a photo transistor, a photo gate, and/or a pinned photo diode (PPD).

A plurality of isolation regions may be formed between the photo detecting elements 121, 122 and 123 in the epitaxial layer 102. The isolation regions, may be formed in the epitaxial layer 102 from a front surface 110a. The isolation regions may include field oxide formed using a shallow trench isolation (STI) process and/or a local oxidation of silicon (LOCOS) process.

Figure 3C:
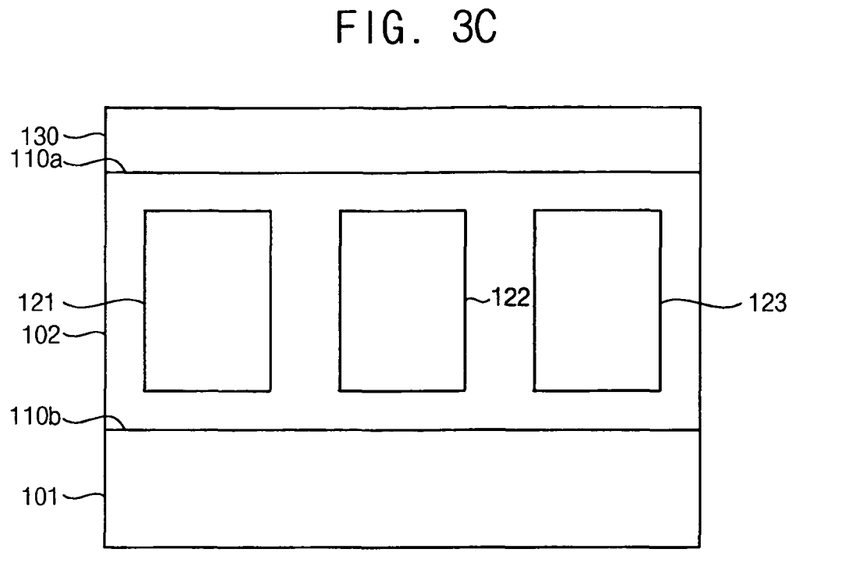

Referring to FIG. 3C, a first dielectric layer 130 may be formed on the front surface 110a of the epitaxial layer 102. The first dielectric layer 130 may be formed of materials having fluidity (e.g., high density plasma (HDP) oxide, tonen silazene (TOSZ), spin on glass (SOG), undoped silica glass (USG), and/or the like). A plurality of gate structures and multi-layer metal lines may be formed in the first dielectric layer 130. For example, the gate structures may be formed by forming a gate dielectric layer and a gate conductive layer on the front surface 110a, and by patterning the gate dielectric layer and the gate conductive layer. The gate dielectric layer may be formed of, for example, silicon oxide (SiOx), silicon oxynitride (SiOxNy), silicon nitride (SiNx), germanium oxynitride (GeOxNy), germanium silicon oxide (GeSixOy), and/or material having a high dielectric constant (e.g. hafnium oxide (HfOx), zirconium oxide (ZrOx), aluminum oxide (AlOx), tantalum oxide (TaOx), hafnium silicate (HfSix), and/or zirconium silicate (ZrSix)). The gate conductive layer may be formed of polysilicon, metal, metal compound, and/or the like. The metal lines may be formed by forming a conductive layer of copper, tungsten, titanium, aluminum, and/or the like, and by patterning the conductive layer.

Figure 3D:
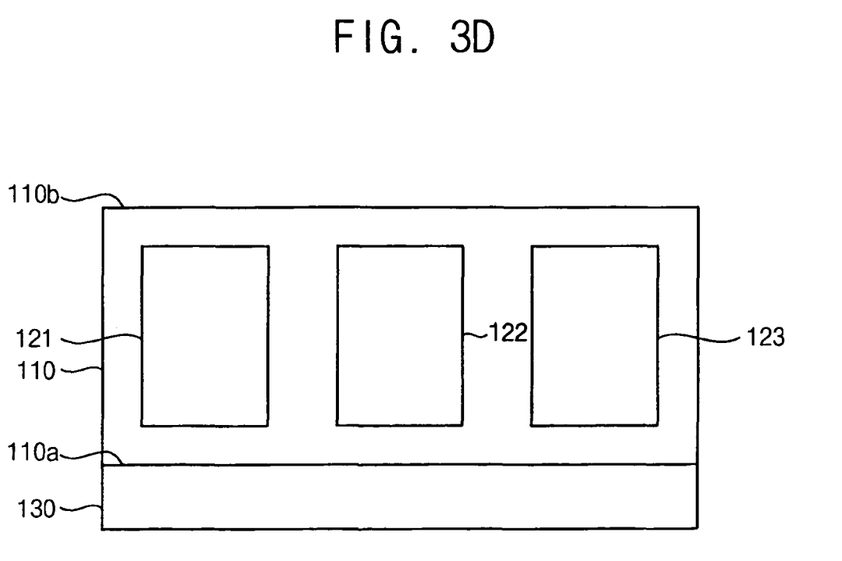

Referring to FIG. 3D, a semiconductor substrate 110 may be formed by grinding the bulk silicon substrate 101 on which the epitaxial layer 102 is formed. For example, the bulk silicon substrate 101 may be removed to a depth using, for example, a chemical mechanical planarization (CMP) process. According to example embodiments, the semiconductor substrate 110 may include only the epitaxial layer 102 after a complete removal of the bulk silicon substrate 101. The semiconductor substrate 110 may be supported by, for example, an additional semiconductor substrate formed on the first dielectric layer 130. A wet etching process may be performed to minimize and/or reduce contamination on the back surface 110b of the semiconductor substrate 110.

According to example embodiments, a backside doping layer (not shown) heavily doped with p-type impurities may be formed between the back surface 110b and the photo detecting elements 121, 122 and 123 in the semiconductor substrate 110. An anti-reflection layer (ARL) (not shown) may be formed on the back surface 110b of the semiconductor substrate 110 to prevent incident light from being reflected from the back surface 110b.

Figure 3E:
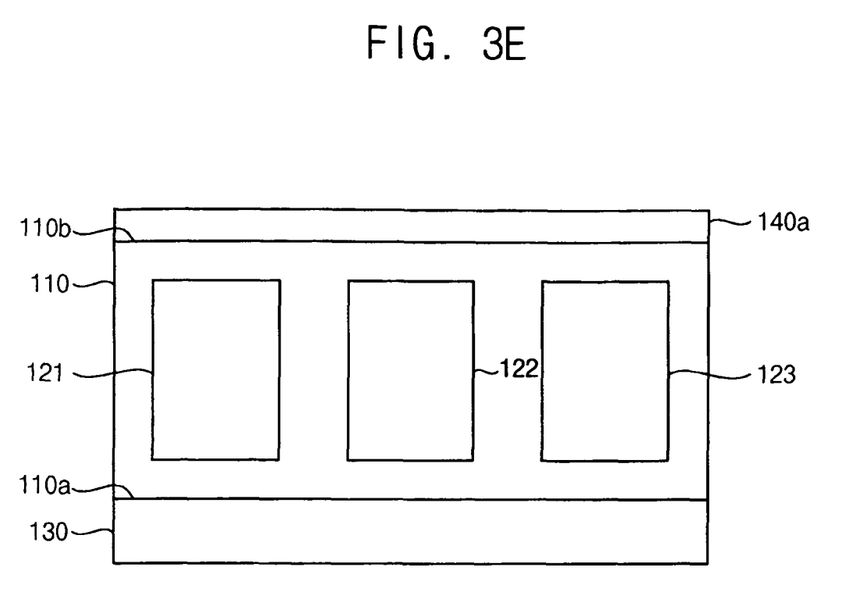

Referring to FIG. 3E, a dielectric layer 140a may be formed on the back surface 110b of the semiconductor substrate 110. The dielectric layer 140a may be formed of, for example, HDP oxide, TOSZ, SOG, and/or USG According to example embodiments of the inventive concepts, the dielectric layer 140a may include an optical shielding layer (not shown) for preventing incident light from entering an optical black area. The dielectric layer 140a may constitute a second dielectric layer 140 of FIG. 3h along with an additional dielectric layer to be formed.

Figure 3F:
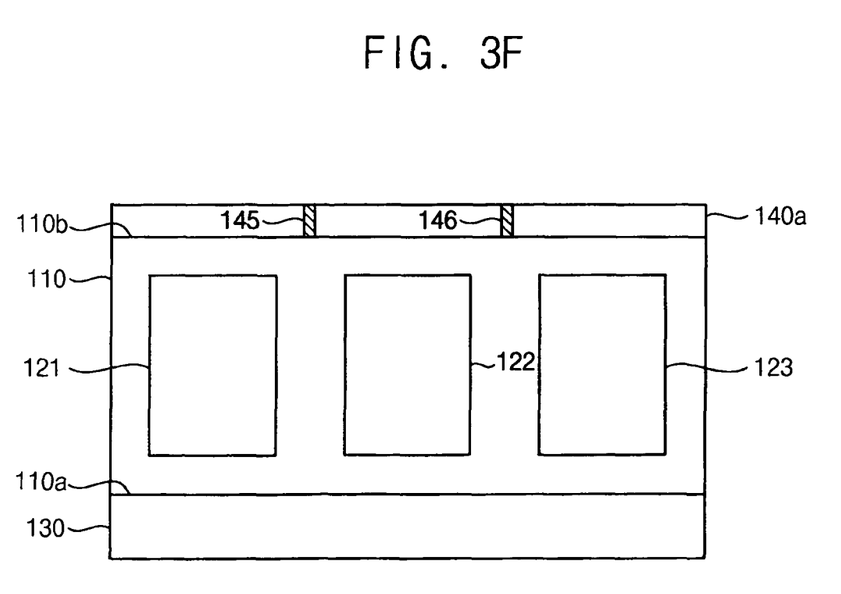

Referring to FIG. 3F, a plurality of contacts 145 and 146 may be formed through the dielectric layer 140a. The contacts 145 and 146 may be electrically coupled to the back surface 110b of the semiconductor substrate 110. The contacts 145 and 146 may electrically couple a plurality of metal lines 143 and 144 of FIG. 3G to the semiconductor substrate 110. The contacts 145 and 146 may be formed by forming a plurality of through holes using, for example, a partial etching process and by filling the through holes with conductive materials. For example, the contacts 145 and 146 may be formed of tungsten, aluminum, copper, titanium, tungsten nitride, aluminum nitride, titanium nitride, tantalum nitride, and/or the like.

Figure 3G:
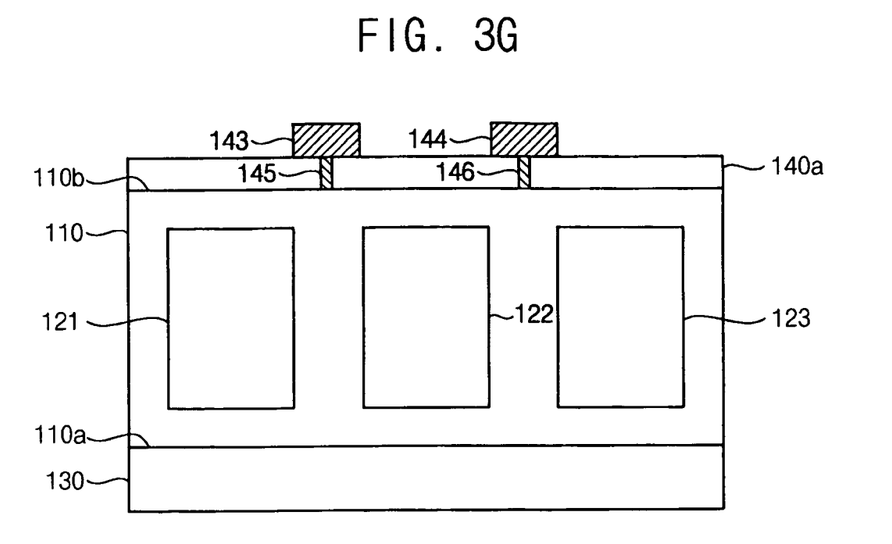

Referring to FIG. 3G, metal lines 143 and 144 may be formed on the dielectric layer 140a where the contacts 145 and 146 are formed. The metal lines 143 and 144 may be formed by forming a conductive layer of, for example, copper, tungsten, titanium, aluminum, and/or the like, and by patterning the conductive layer. The metal lines 143 and 144 may be on regions between the photo detecting elements 121, 122 and 123, and a ratio of a photo detecting region to a whole size may not decrease.

Figure 3H:
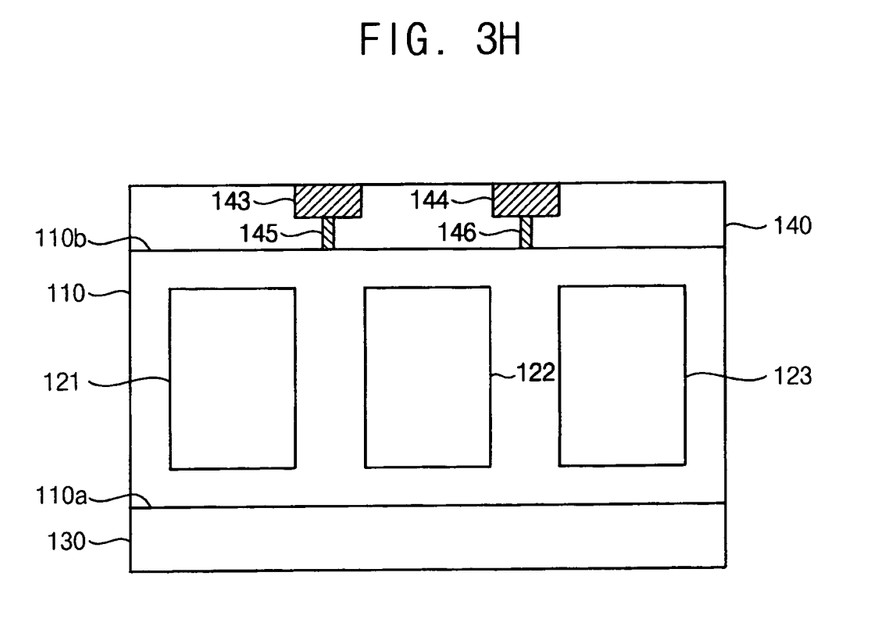

Referring to FIG. 3H, a second dielectric layer 140 may be formed on the back surface 110b of the semiconductor substrate 110. The second dielectric layer 140 may be formed by forming an additional dielectric layer (not shown separately) of materials having fluidity on the dielectric layer 140b. The second dielectric layer 140 may have a multi-layer structure including the dielectric layer 140b and the additional dielectric layer. The additional dielectric layer may be formed of, for example, HDP oxide, TOSZ, SOG, USG, flowable oxide (FOX), and/or the like.

Figure 3I:
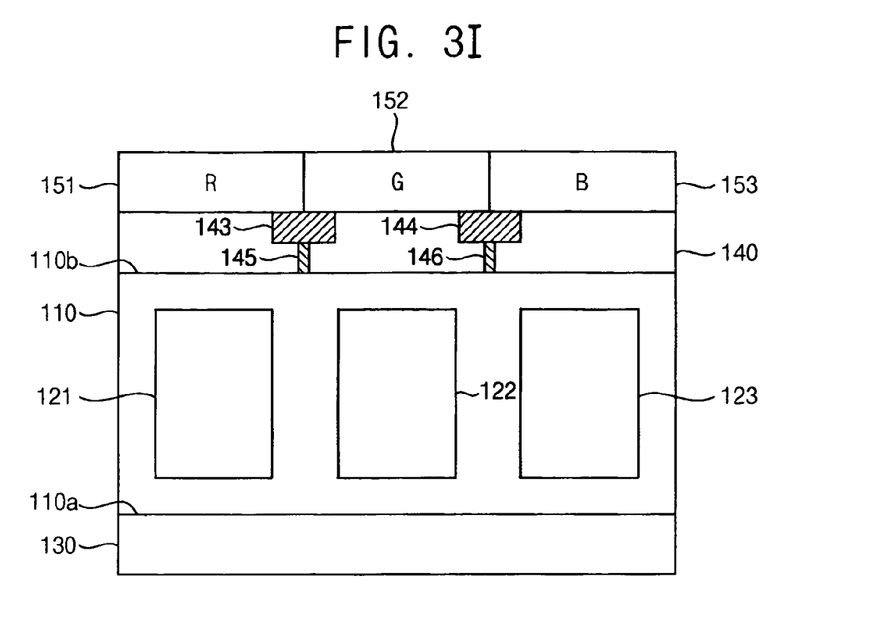

Referring to FIG. 3I, a plurality of color filters 151, 152 and 153 may be formed on the second dielectric layer 140. The color filters 151, 152 and 153 may be disposed so as to correspond to the photo detecting elements 121, 122 and 123, respectively. The color filters 151, 152 and 153 may be formed using a dye process, a pigment dispersing process, a printing process, and/or the like. According to example embodiments of the inventive concepts, a planarization layer (not shown), for example an over-coating layer (OCL), may be formed between the color filters 151, 152 and 153 and micro lenses 161, 162 and 163 of FIG. 3J.

Figure 3J:
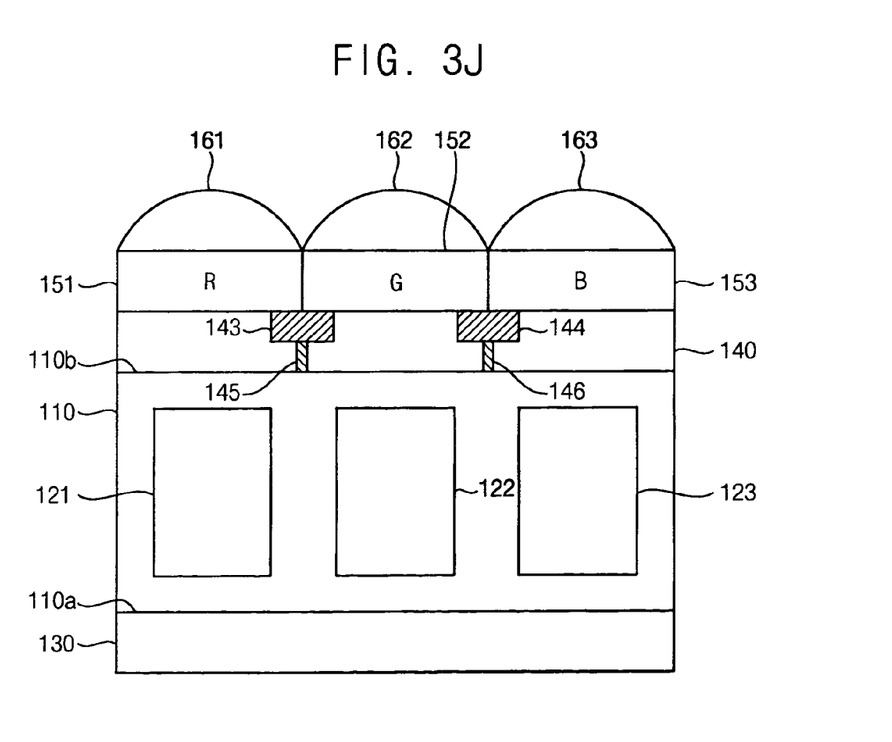

Referring to FIG. 3J, a plurality of micro lenses 161, 162 and 163 may be formed on the color filters 151, 152 and 153. The micro lenses 161, 162 and 163 may be disposed so as to correspond to the photo detecting elements 121, 122 and 123, respectively. For example, the micro lenses 161, 162 and 163 may be formed by forming patterns corresponding to the photo detecting elements 121, 122 and 123 with photoresists having light-penetrability and by reflowing the patterns to have convex shapes. A bake process may be performed on the micro lenses 161, 162 and 163 to maintain the convex shapes.

Although methods of fabricating the image sensor of FIG. 1 are described with reference to FIGS. 3A-3J, methods of fabricating image sensors according to example embodiments of the inventive concepts are not to be construed as limited to the specific methods disclosed.

Figure 4:
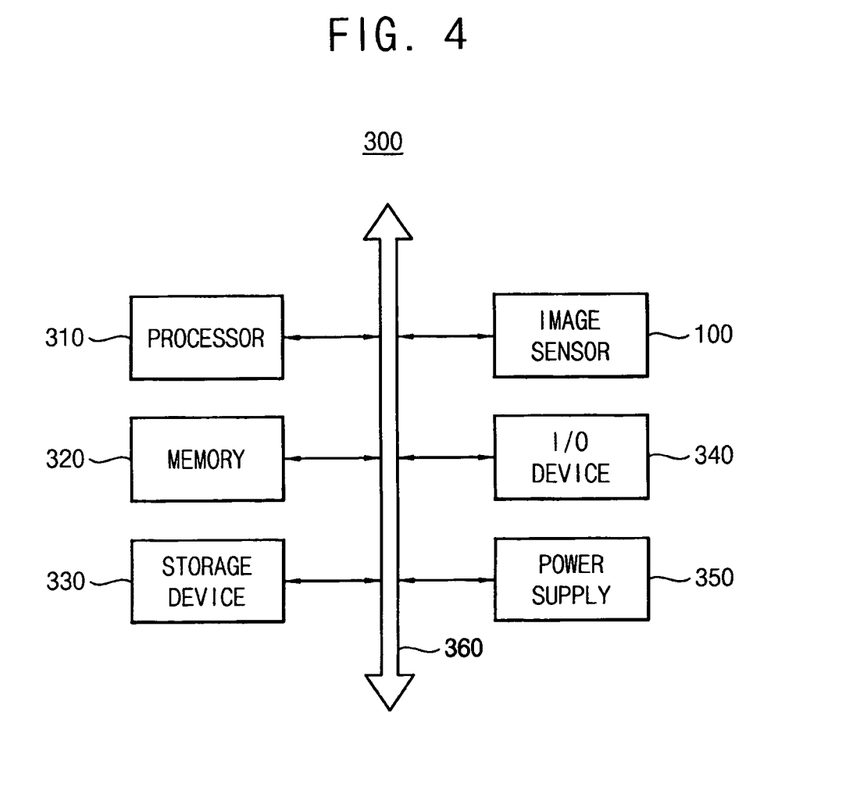
FIG. 4 is a block diagram illustrating a system including the image sensor of FIG. 1.

FIG. 4 is a block diagram illustrating a system including an image sensor of FIG. 1. Referring to FIG. 4, a system 300 may include an image sensor 100, a processor 310, a memory 320, a storage device 330, an input/output device 340 and a power supply 350. The processor 310 may perform various computing functions, for example, executing specific software for performing specific calculations and/or tasks. For example, the processor 310 may be a microprocessor, a central process unit (CPU), a digital signal processor, and/or the like. The processor 310 may be coupled to the memory device 320 via a bus 360 (e.g., an address bus, a control bus and/or a data bus). For example, the memory device 320 may be a dynamic random access memory (DRAM), a static random access memory (SRAM), and/or a non-volatile memory (e.g., an erasable programmable read-only memory (EPROM), an electrically erasable programmable read-only memory (EEPROM), and/or the like).

The processor 310 may be coupled to an expansion bus, for example, a peripheral-component-interconnect (PCI) bus. The processor 310 may control the input/output device 340 including an input device (e.g., a keyboard and/or a mouse) an output device (e.g., a printer and/or a display device) via the expansion bus. The processor 310 may control the storage device 330 (e.g., a hard disk drive, a compact disk read-only memory (CD-ROM), and/or a solid state drive (SSD)) via the expansion bus. The processor 310 may communicate with the image sensor 100 via the bus 360 and/or a communication link. The power supply 350 may supply operational power of the system 300. The system 300 may include, for example, a video card, a sound card, a memory card, a USB device, and/or a port for communicating with another system.

According to example embodiments of the inventive concepts, the image sensor 100 may be integrated with the processor 310, and/or with the memory device 320. According to example embodiments, the image sensor 100 and the processor 310 may be implemented by separate chips. The image sensor 100 and the system 300 according to example embodiments may be applicable to a computer, a digital camera, a 3-dimensional camera, a mobile phone, a personal digital assistant (PDA), a scanner, a navigator, a video phone, a monitoring system, an auto focus system, a tracking system, a motion capture system, an image stabilizing system, and/or any system including an image sensor.

Figure 5:
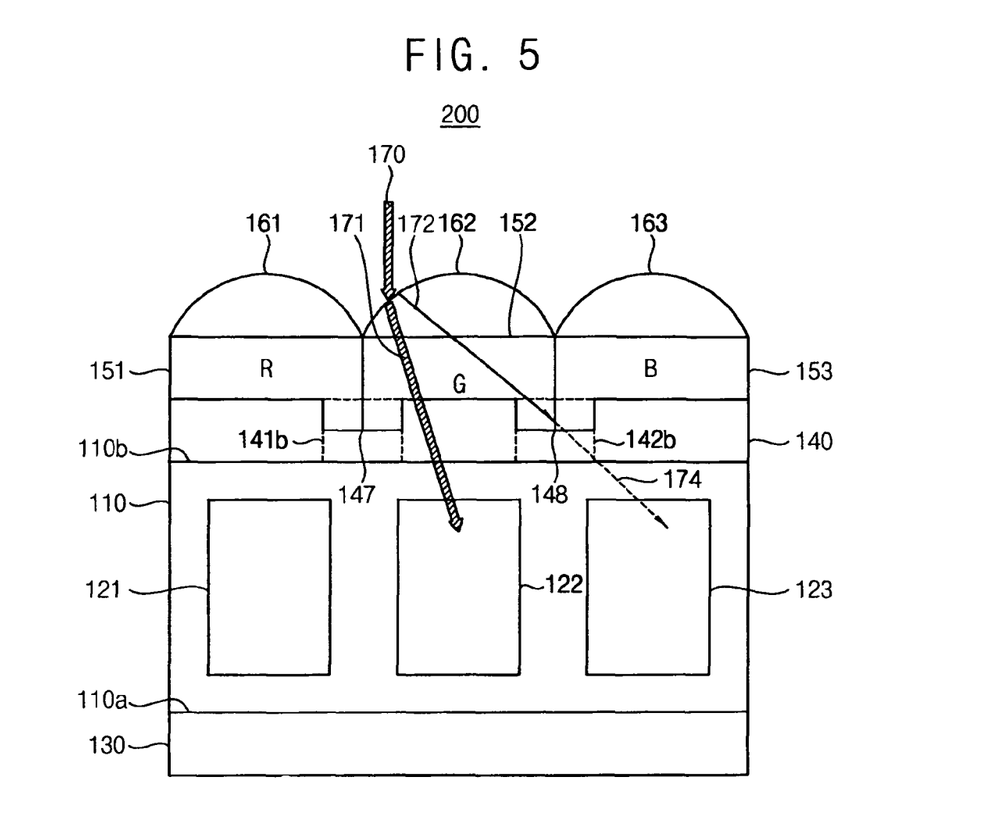
FIG. 5 is a cross-sectional diagram of a portion of an image sensor according to example embodiments of the inventive concepts.

FIG. 5 is a cross-sectional diagram of a portion of an image sensor according to example embodiments of the inventive concepts. Referring to FIG. 5, an image sensor 200 may include a semiconductor substrate 110, a plurality of photo detecting elements 121, 122 and 123, a first dielectric layer 130, a second dielectric layer 140, a plurality of color filters 151, 152 and 153, and a plurality of micro lenses 161, 162 and 163. The semiconductor substrate 110 may have a front surface 110a and a back surface 110b. The photo detecting elements 121, 122 and 123 may be in the semiconductor substrate 110. The photo detecting elements 121, 122 and 123 may convert incident light into an electric signal. The first dielectric layer 130 may be on the front surface 110a of the semiconductor substrate 110.

The first dielectric layer 130 may include a plurality of gate structures that process the electric signal. The second dielectric layer 140 may be formed on the back surface 110b of the semiconductor substrate 110. The second dielectric layer 140 may include a plurality of photo blocking regions 141b and 142b. The photo blocking regions 141b and 142b may be on regions between the photo detecting elements 121, 122 and 123. The color filters 151, 152 and 153 may be on the second dielectric layer 140, and may correspond to the photo detecting elements 121, 122 and 123, respectively. The micro lenses 161, 162 and 163 may be on the color filters 151, 152 and 153, and may correspond to the photo detecting elements 121, 122 and 123, respectively.

The photo blocking regions 141b and 142b may have a shape such that the color filters 151, 152 and 153 vertically extend into the second dielectric layer 140. For example, the second dielectric layer 140 may have a plurality of recesses 147 and 148 adjacent to boundary lines between the color filters 151, 152 and 153. The recesses 147 and 148 of the second dielectric layer 140 may be filled with the color filters 151, 152 and 153. A height of the recesses 147 and 148 may be lower than that of the second dielectric layer 140 and/or may be substantially the same as that of the second dielectric layer 140. According to example embodiments of the inventive concepts, compared to a different fabrication process, the image sensor 200 may be fabricated by adding only an etching process for forming the recesses 147 and 148 in the second dielectric layer 140.

Each recess in each photo blocking region may be filled with at least two color filters that pass different color components of the incident light. For example, a first recess 147 may be filled with a first color filter 151 that passes a red componenteR of the incident light and a second color filter 152 that passes a green component G of the incident light. A second recess 148 may be filled with the second color filter 152 that passes the green component G of the incident light and a third color filter 153 that passes a blue component B of the incident light. The color filters in each photo blocking region may reduce a diffraction component of the incident light by filtering the diffraction component at least two times.

A path of incident light 170 passing through a second micro lens 162 may be adjusted to enter a second photo detecting element 122 by the second micro lens 162. A main component 171 of the incident light 170 may correctly reach the second photo detecting element 122. If the incident light 170 is diffracted by the second micro lens 162, a diffraction component 172 of the incident light 170 may be directed to a third photo detecting element 123. The second and third color filters 152 and 153 in the second photo blocking region 142b may reduce the diffraction component 172 by filtering the diffraction component 172 two times. A reduced diffraction component 174 of which energy may be reduced by the second photo blocking region 142b may have negligible and/or reduced energy and charge collection of the third photo detecting element 123 may not be substantially affected by the reduced diffraction component 174.

In the image sensor 200 according to example embodiments of the inventive concepts, the color filters 151, 152 and 153 in the photo blocking regions 141b and 142b may reduce the diffraction component of the incident light, thereby suppressing and/or reducing optical crosstalk. Because the photo blocking regions 141b and 142b are formed on regions between the photo detecting elements 121, 122 and 123 using, for example, a simple additional etch process, a fill factor may not decrease and the image sensor 200 may be fabricated at low and/or reduced cost.

Figure 6:
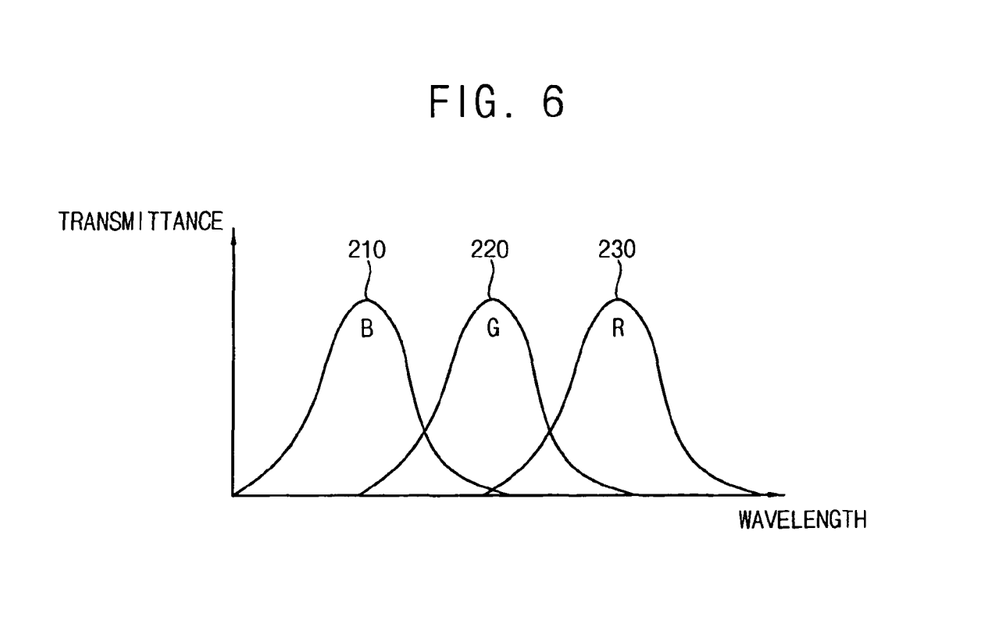
FIG. 6 is a graph of Transmittance as a function of Wavelength for a spectrum of light passing through a plurality of color filters included in the image sensor of FIG. 5.

FIG. 6 is a graph of Transmittance as a function of Wavelength for a spectrum of light passing through a plurality of color filters included in an image sensor of FIG. 5. In FIG. 6, transmittance of light of first through third color filters 151, 152 and 153 of FIG. 5 is illustrated according to a wavelength of an incident light. Referring to FIGS. 5 and 6, each color filter 151, 152 and 153 may be one of a blue filter 210, a green filter 220 and a red filter 230. The blue filter 210, the green filter 220 and the red filter 230 may have different transmittance according to the wavelength of the incident light. For example, if a second color filter 152 corresponding to a second photo detecting element 122 is the green filter 220 and a third color filter 153 corresponding to a third photo detecting element 123 is the blue filter 210, a diffraction component 172 of an incident light 170 may be filtered by the green filter 220, and the incident light 170 filtered by the green filter 220 may be filtered again by the blue filter 210. A reduced diffraction component 174 filtered by the green filter 220 and the blue filter 210 may have negligible and/or reduced energy, and charge collection of the third photo detecting element 123 may not be substantially affected by the reduced diffraction component 174.

Figure 7A:
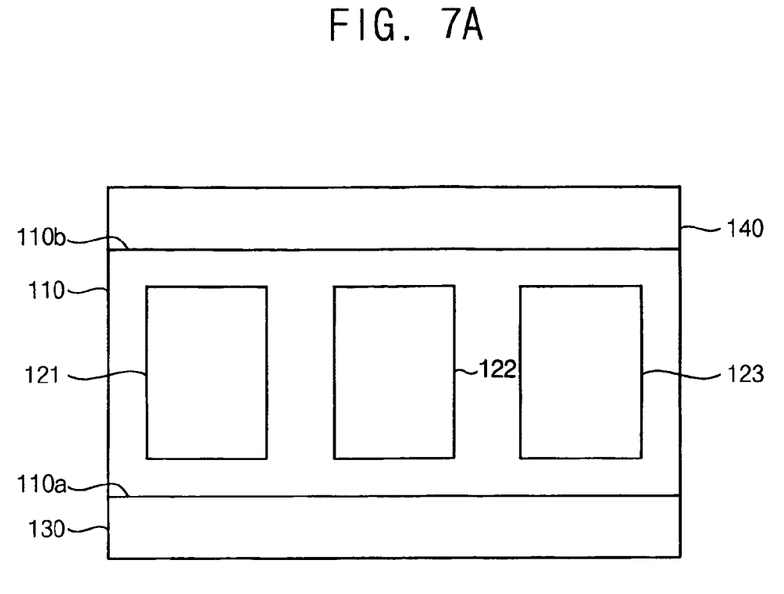
FIGS. 7A-7D are cross-sectional diagrams illustrating methods of fabricating the image sensor of FIG. 5.
Figure 7B:
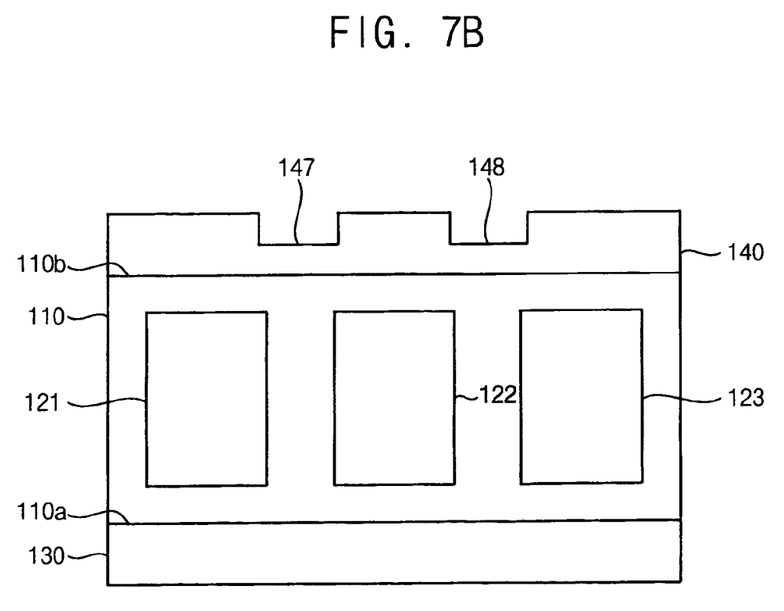

FIGS. 7A-7D are cross-sectional diagrams illustrating methods of fabricating the image sensor of FIG. 5. Referring to FIG. 7A, a second dielectric layer 140 may be formed on a back surface 110b of a semiconductor substrate 110 of, for example, FIG. 3A. The second dielectric layer 140 may be formed of HDP oxide, TOSZ, SOG and/or USG Referring to FIG. 7B, a plurality of recesses 147 and 148 may be formed in the second dielectric layer 140. The recesses 147 and 148 may be formed by, for example, etching the second dielectric layer 140 through a mask. The recesses 147 and 148 may be formed on regions between a plurality of photo detecting elements 121, 122 and 123. The recesses 147 and 148 may have a height lower than and/or substantially the same as that of the second dielectric layer 140.

Figure 7C:
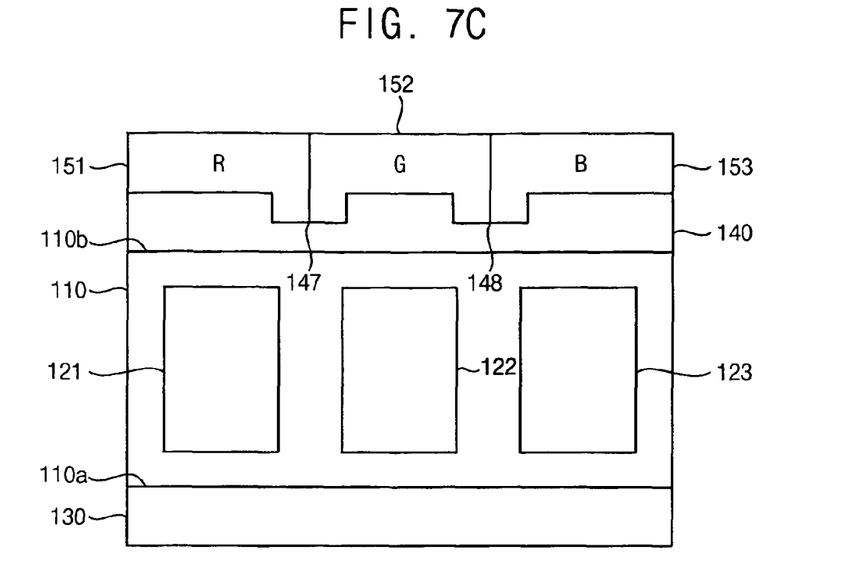

Referring to FIG. 7C, a plurality of color filters 151, 152 and 153 may be formed on the second dielectric layer 140, and may be disposed so as to correspond to the photo detecting elements 121, 122 and 123, respectively. The color filters 151, 152 and 153 may be formed to fill the recesses 147 and 148 in the second dielectric layer 140. A first recess 147 may be filled with a first color filter 151 and a second color filter 152. A second recess 148 may be filled with the second color filter 152 and a third color filter 153. A diffraction component of an incident light may be filtered at least two times and a diffraction component may be reduced.

Figure 7D:
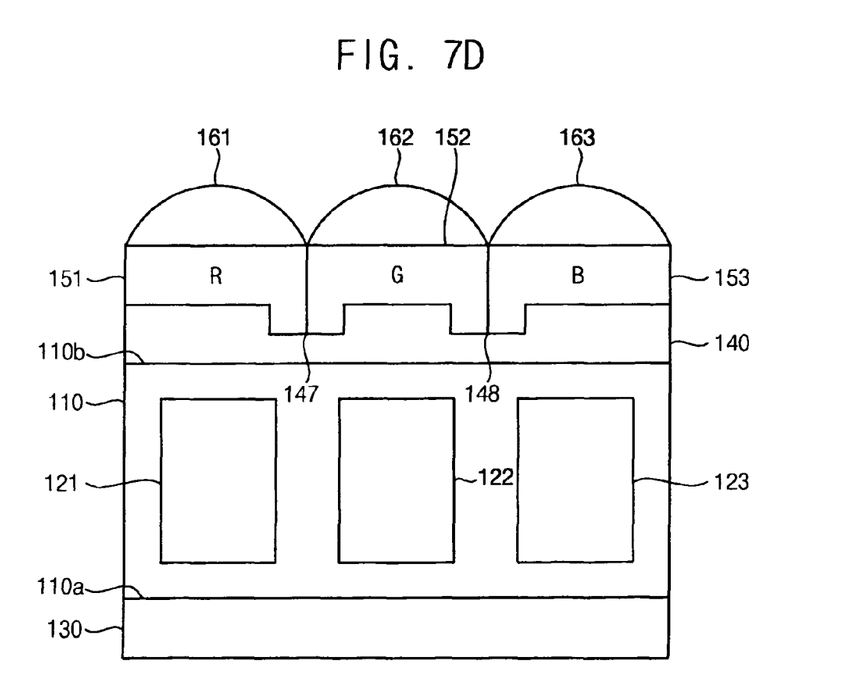

Referring to FIG. 7D, a plurality of micro lenses 161, 162 and 163 may be formed on the color filters 151, 152 and 153, and may be disposed so as to correspond to the photo detecting elements 121, 122 and 123, respectively. The image sensor 200 of FIG. 5 may be simply fabricated by adding an etching process that forms the recesses 147 and 148 to an image sensor fabrication process.

Image sensors according to example embodiments of the inventive concepts may efficiently suppress and/or reduce optical crosstalk without decreasing fill factor. Image sensor according to example embodiments may be applicable to, for example, any back-illuminated image sensor and a system including the back-illuminated image sensor. A system including a back-illuminated image sensor may include, for example, a computer, a digital camera, a 3-dimensional camera, a mobile phone, a personal digital assistant (PDA), a scanner, a navigator, a video phone, a monitoring system, an auto focus system, a tracking system, a motion capture system, an image stabilizing system and/or the like.

While example embodiments have been particularly shown and described, it will be understood by one of ordinary skill in the art that variations in form and detail may be made therein without departing from the spirit and scope of the claims.

What is claimed is:

1. An image sensor, comprising:
   a semiconductor substrate;
   first and second photo detecting elements in the semiconductor substrate, the first and second photo detecting elements being configured to convert incident light into at least one electric signal;
   a backside dielectric layer on the semiconductor substrate, the backside dielectric layer being on a back surface of the semiconductor substrate;
   a photo blocking region in the backside dielectric layer, the photo blocking region being on a region of the semiconductor substrate that is at least one of between and adjacent to the first and second photo detecting elements, and the photo blocking region including,
      one or more metal lines, and
      a contact configured to electrically connect the one or more metal lines to the semiconductor substrate, the contact being configured to discharge holes in the semiconductor substrate through the one or more metal lines;
   first and second color filters on the backside dielectric layer, the first and second color filters corresponding to the first and second photo detecting elements;
   first and second micro lenses on the first and second color filters, the first and second micro lenses corresponding to the first and second photo detecting elements;
   a front side dielectric layer on a front surface of the semiconductor substrate; and
   at least one gate structure in the front side dielectric layer, the at least one gate structure being configured to transfer and amplify the at least one electric signal.

2. The image sensor of claim 1, wherein
   the one or more metal lines is configured to reflect a diffraction component of the incident light, the diffraction component being at least a part of the incident light diffracted by at least one of the first and second micro lenses.

3. The image sensor of claim 1, wherein the one or more metal lines is a plurality of metal lines, and
   the plurality of metal lines are in a grid pattern.

4. The image sensor of claim 1, wherein the one or more metal lines is a plurality of metal lines, and
   the plurality of metal lines include at least one ground line.

5. An image sensor, comprising:
   a semiconductor substrate;
   a plurality of photo detecting elements in the semiconductor substrate;
   the plurality of photo detecting elements being configured to convert incident light into at least one electric signal;
   a backside dielectric layer on a back surface of the semiconductor substrate, the backside dielectric layer being on a back surface of the semiconductor substrate;
   a plurality of metal lines in the backside dielectric layer on regions of the substrate between the plurality of photo detecting elements, the plurality of metal lines include a plurality of contacts configured to electrically connect the metal lines to the semiconductor substrate, the plurality of contacts being configured to discharge holes in the semiconductor substrate through the plurality of metal lines;
   a plurality of color filters on the backside dielectric layer, the plurality of color filters corresponding to the plurality of photo detecting elements;
   a plurality of micro lenses on the plurality of color filters, the plurality of micro lenses corresponding to the plurality of photo detecting elements;
   a front side dielectric layer on a front surface of the semiconductor substrate; and
   at least one gate structure in the front side dielectric layer, the at least one gate structure being configured to transfer and amplify the at least one electric signal.

6. The image sensor of claim 5, wherein the plurality of metal lines are configured to reflect a diffraction component of the incident light, the diffraction component being at least a part of the incident light diffracted by the plurality of micro lenses.

7. The image sensor of claim 5, wherein the plurality of metal lines are in a grid pattern.

8. The image sensor of claim 5, wherein the plurality of metal lines include a plurality of ground lines.

9. An image sensor, comprising:
   a semiconductor substrate;
   a plurality of photo detecting elements in the semiconductor substrate, the plurality of photo detecting elements being configured to convert incident light into at least one electric signal;
   a dielectric layer on a back surface of the semiconductor substrate;
   a plurality of color filters on the dielectric layer, the plurality of color filters corresponding to the plurality of photo detecting elements, the plurality of color filters including a plurality of extensions extending into a plurality of regions of the dielectric layer, the plurality of regions of the dielectric layer being on regions of the substrate that are between the plurality of photo detecting elements, the plurality of extensions being configured such that a diffraction component of the incident light is filtered at least twice by at least two different color filters from among the plurality of color filters; and
   a plurality of micro lenses on the plurality of color filters, the plurality of micro lenses corresponding to the plurality of photo detecting elements, the diffraction component being a component of the incident light diffracted by one of the plurality of micro lenses.

10. The image sensor of claim 9, wherein each of the plurality of extensions is configured to pass a different color component of the incident light.

11. The image sensor of claim 9, wherein the dielectric layer includes a plurality of recesses at interfaces between the plurality of color filters, and the plurality of color filters include a plurality of protrusions of the dielectric layer that correspond to the plurality of recesses.

12. An image sensor, comprising:
    a semiconductor substrate;
    first and second photo detecting elements in the semiconductor substrate, the first and second photo detecting elements being configured to convert incident light into at least one electric signal;
    a dielectric layer on the semiconductor substrate;
    first and second color filters on the dielectric layer, the first and second color filters corresponding to the first and second photo detecting elements;

a photo blocking region in the dielectric layer, the photo blocking region being on a region of the semiconductor substrate that is at least one of between and adjacent to the first and second photo detecting elements, the photo blocking region including extensions of the first and second color filters, the extensions being configured such that a diffraction component of the incident light is filtered at least twice by the first and second color filters; and first and second micro lenses on the first and second color filters, the first and second micro lenses corresponding to the first and second photo detecting elements, the diffraction component being at least a part of the incident light diffracted by at least one of the first and second micro lenses.

13. The image sensor of claim 12, wherein the extensions of the first and second color filters each pass a different color component of the incident light.

14. The image sensor of claim 12, wherein the photo blocking region includes a recess in the dielectric layer at an interface between the first and second color filters, and the extensions of the first and second color filters extend into the recess.

\* \* \* \* \*